US010979604B2

(12) United States Patent
Machii

(10) Patent No.: US 10,979,604 B2
(45) Date of Patent: Apr. 13, 2021

(54) CAMERA MODULE WITH IMAGING UNIT AND LIGHT EMITTER

(71) Applicant: Panasonic Intellectual Property Management Co., Ltd., Osaka (JP)

(72) Inventor: Eiji Machii, Kanagawa (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 193 days.

(21) Appl. No.: 16/027,316

(22) Filed: Jul. 4, 2018

(65) Prior Publication Data
US 2018/0332198 A1 Nov. 15, 2018

Related U.S. Application Data

(63) Continuation of application No. PCT/JP2016/004600, filed on Oct. 17, 2016.

(30) Foreign Application Priority Data

Jan. 21, 2016 (JP) .............................. JP2016-009588

(51) Int. Cl.
H04N 5/225 (2006.01)
G03B 17/02 (2021.01)
(Continued)

(52) U.S. Cl.
CPC ........... *H04N 5/2252* (2013.01); *G03B 15/03* (2013.01); *G03B 17/02* (2013.01); *H04N 5/2256* (2013.01);
(Continued)

(58) Field of Classification Search
CPC .. H04N 5/2257; H04N 5/2251; H04N 5/2252; H04N 5/2256;
(Continued)

(56) References Cited

U.S. PATENT DOCUMENTS

2004/0132491 A1* 7/2004 Kim ..................... H04M 1/0218
455/556.1
2005/0001905 A1* 1/2005 Shinomiya ........... H04N 5/2251
348/207.99
(Continued)

FOREIGN PATENT DOCUMENTS

JP 09-214085 A 8/1997
JP 11-341310 A 12/1999
(Continued)

OTHER PUBLICATIONS

International Search Report for corresponding App. No. PCT/JP2016/004600, dated Dec. 27, 2016.

*Primary Examiner* — Joel W Fosselman
(74) *Attorney, Agent, or Firm* — Renner, Otto, Boisselle & Sklar, LLP

(57) ABSTRACT

A circuit board includes a first rigid printed wiring board mounted with an imaging unit, a second rigid printed wiring board mounted with an LED, and a foldable first flexible printed wiring board coupling the first rigid printed wiring board and the second rigid printed wiring board. A shield case is further included for holding the second rigid printed wiring board in a state in which the first flexible printed wiring board is folded an even number of times, a first main face of the second rigid printed wiring board and a first main face of the first rigid printed wiring board face in an identical direction, and the second rigid printed wiring board lies at a separated position from the first main face of the first rigid printed wiring board.

8 Claims, 5 Drawing Sheets

(51) Int. Cl.
  *H05K 1/02* (2006.01)
  *G03B 15/03* (2021.01)
  *H05K 1/14* (2006.01)
  *H05K 1/18* (2006.01)
  *H05K 9/00* (2006.01)
  *H05K 3/36* (2006.01)

(52) U.S. Cl.
  CPC ......... *H04N 5/22521* (2018.08); *H05K 1/028* (2013.01); *H05K 1/148* (2013.01); *H05K 1/189* (2013.01); *H05K 9/0022* (2013.01); *H05K 1/181* (2013.01); *H05K 3/368* (2013.01); *H05K 2201/10106* (2013.01); *H05K 2201/10121* (2013.01); *H05K 2201/10151* (2013.01); *H05K 2201/2036* (2013.01)

(58) Field of Classification Search
  CPC ... G02B 13/001–009; G02B 7/04–105; H04M 1/0264; H01L 27/14618; H05K 1/028; H05K 1/148; H05K 1/00; H05K 2201/10; H05K 9/0022; G03B 15/03; G03B 17/02
  See application file for complete search history.

(56) References Cited

U.S. PATENT DOCUMENTS

2014/0085496 A1\* 3/2014 Eromaki ............. H04N 5/2254
                                                              348/208.7
2014/0111682 A1    4/2014 Flugge

FOREIGN PATENT DOCUMENTS

| | | |
|---|---|---|
| JP | 2004-215223 A | 7/2004 |
| JP | 2004-297660 A | 10/2004 |
| JP | 2005-204729 A | 8/2005 |
| JP | 2008-182490 A | 8/2008 |
| JP | 2009-247621 A | 10/2009 |
| JP | 2010-141629 A | 6/2010 |
| JP | 2015-146033 A | 8/2015 |

\* cited by examiner

CAMERA MODULE WITH IMAGING UNIT AND LIGHT EMITTER

BACKGROUND

1. Technical Field

The present disclosure relates to a camera module including an imaging unit and a light emitter.

2. Description of Related Art

Unexamined Japanese Patent Publication No. 2004-297660 discloses a camera module including an imaging unit and a light emitter for illuminating illumination light. The imaging unit and the light emitter are coupled to each other through a flexible printed wiring board.

In the camera module according to Unexamined Japanese Patent Publication No. 2004-297660, the imaging unit is mounted on a first face lying at an end of the flexible printed wiring board, while the light emitter is mounted on a second face lying at another end of the flexible printed wiring board. The flexible printed wiring board is folded so that the light emitter is disposed on the imaging unit.

SUMMARY

A camera module according to a first aspect of the present disclosure includes an imaging unit for capturing an image of an object, a light emitter for illuminating the object with illumination light, and a circuit board having a first main face mounted with the imaging unit and the light emitter.

The circuit board includes, a first rigid printed wiring board mounted with the imaging unit, a second rigid printed wiring board mounted with the light emitter, and a foldable flexible printed wiring board coupling the first rigid printed wiring board and the second rigid printed wiring board.

Further included is a holder for holding the second rigid printed wiring board in a state in which the flexible printed wiring board is folded an even number of times, a first main face of the second rigid printed wiring board and a first main face of the first rigid printed wiring board face in an identical direction, and the second rigid printed wiring board lies at a separated position from the first main face of the first rigid printed wiring board.

A camera module according to a second aspect of the present disclosure includes an imaging unit for capturing an image of an object, a light emitter for illuminating the object with illumination light, and a circuit board having a first main face mounted with the imaging unit and the light emitter.

The circuit board includes, a first rigid printed wiring board mounted with the imaging unit, a second rigid printed wiring board mounted with the light emitter, and a foldable flexible printed wiring board coupling the first rigid printed wiring board and the second rigid printed wiring board.

Further included is a holder configured to be capable of disposing the second rigid printed wiring board in a state in which the flexible printed wiring board is folded an even number of times, a first main face of the second rigid printed wiring board and a first main face of the first rigid printed wiring board face in an identical direction, and the second rigid printed wiring board lies at a separated position from the first main face of the first rigid printed wiring board, and capable of holding the second rigid printed wiring board at the separated position.

With the camera module according to the present disclosure, processes for mounting the imaging unit and the light emitter can be simplified, and an illumination area into which the light emitter illuminates illumination light can appropriately be secured.

DETAILED DESCRIPTION

Exemplary embodiments will be described herein in detail with reference to the drawings appropriately. However, detailed description more than necessary may be omitted. For example, in some cases, detailed description of already well-known items and repeated description with respect to substantially the same configuration will be omitted. These omissions are made to avoid unnecessary redundancy of the following description and to facilitate the understanding of those skilled in the art.

Note that the inventor of the present disclosure provides the accompanying drawings and the following description in order to allow those skilled in the art to fully understand the present disclosure, and the accompanying drawings and the following description do not intend to limit the subject matter as described in the appended claims.

First Exemplary Embodiment

With reference to the drawings, a description is provided hereinafter of a first exemplary embodiment.

1. Configuration

1-1. Outline of Electronic Device

Figure 1:
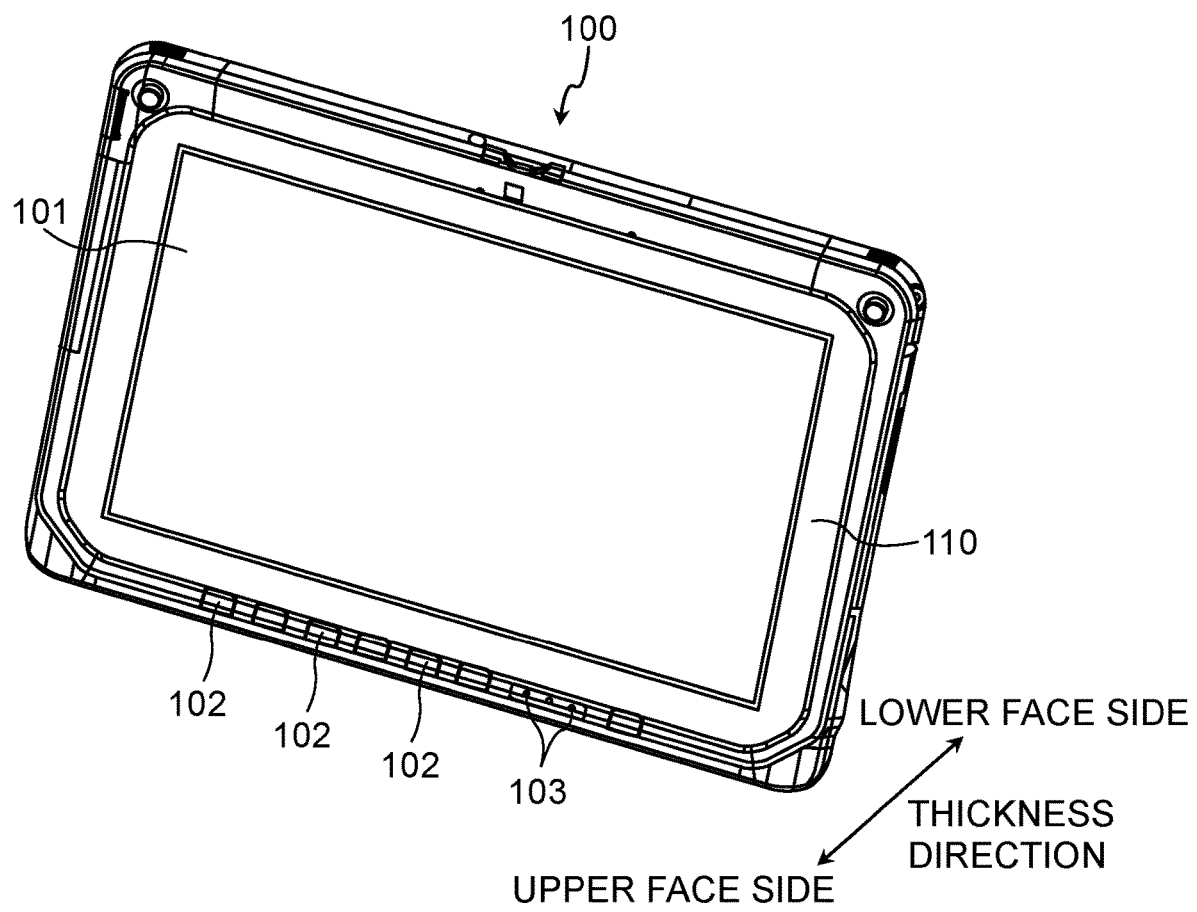
FIG. 1 is a perspective view of an upper face (front face) of an electronic device including a camera module according to an exemplary embodiment of the present disclosure.

FIG. 1 is a perspective view of an upper face (front face) of an electronic device including a camera module according to the present exemplary embodiment. In FIG. 1, for purpose of convenience, a side of electronic device 100 in a thickness direction refers to an "upper face side," and another side refers to a "lower face side." As shown in FIG. 1, electronic device 100 is a tablet computer. Electronic device 100 has, on its upper face, display 101, operation switches 102, and indicators 103. Display 101 is, for example, a liquid crystal display panel. Display 101 is also a touch panel capable of accepting a touch operation performed by a user. Operation switches 102 are hardware switches each capable of accepting a depression operation performed by the user. Indicators 103 are display devices each capable of displaying an operating state or the like of electronic device 100. Indicators 103 are each composed of a light-emitting diode (LED), for example.

Electronic device 100 is incorporated with a processing unit such as a central processing unit (CPU), storage devices (recording devices) such as a random access memory (RAM), a read only memory (ROM), and a solid state drive (SSD), a battery, and other components. The ROM and the SSD stores, for example, an operating system (OS), various application programs, and various data. The CPU reads the OS, the application programs, and the various data, and executes arithmetic processing to achieve various functions according to a content of an operation performed by the user.

Figure 2:
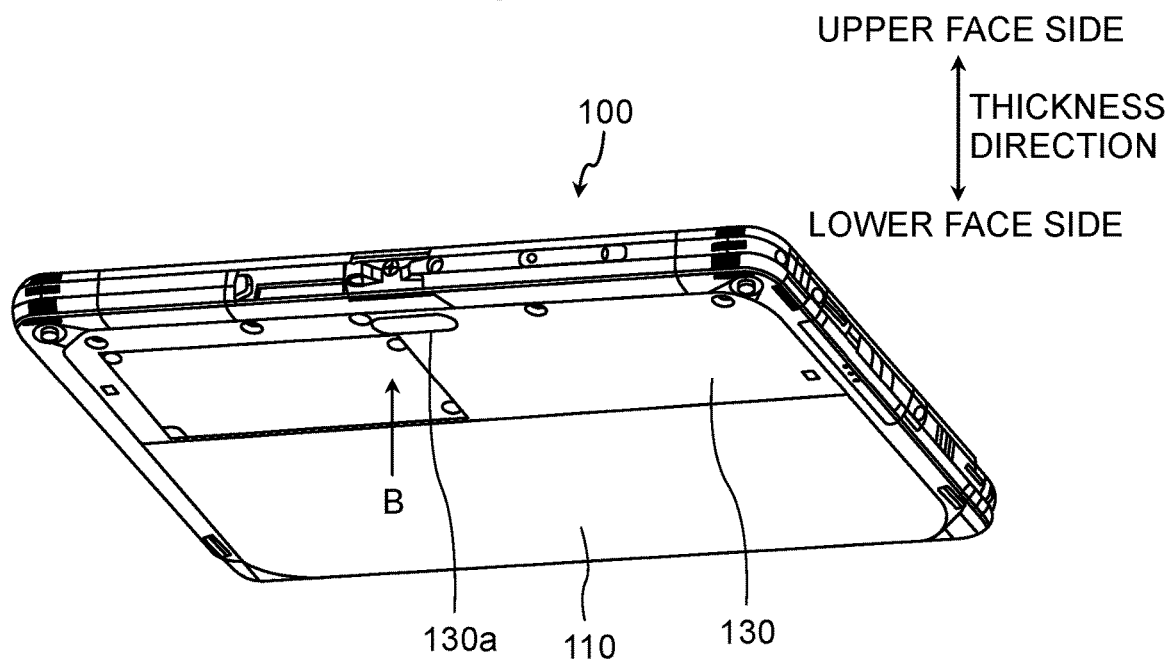
FIG. 2 is a perspective view of a lower face (rear face) of the electronic device including the camera module according to the present exemplary embodiment.

FIG. 2 is a perspective view of a lower face (rear face) of electronic device 100 including the camera module according to the present exemplary embodiment. Electronic device 100 includes a camera. Opening 130a for the camera is provided on lid 130 configuring a lower face of housing main body 110. A configuration of the camera module configuring the camera will now be described herein.

1-2. Configuration of Camera Module

Figure 3:
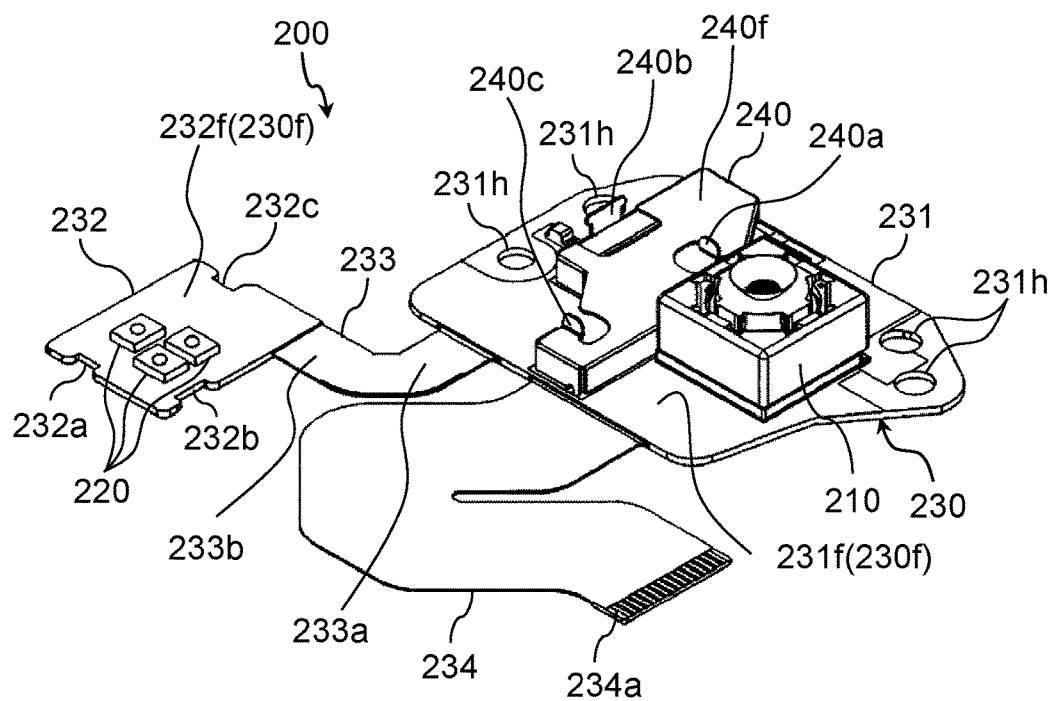
FIG. 3 is a perspective view of the camera module (first state) according to the present exemplary embodiment.
Figure 4:
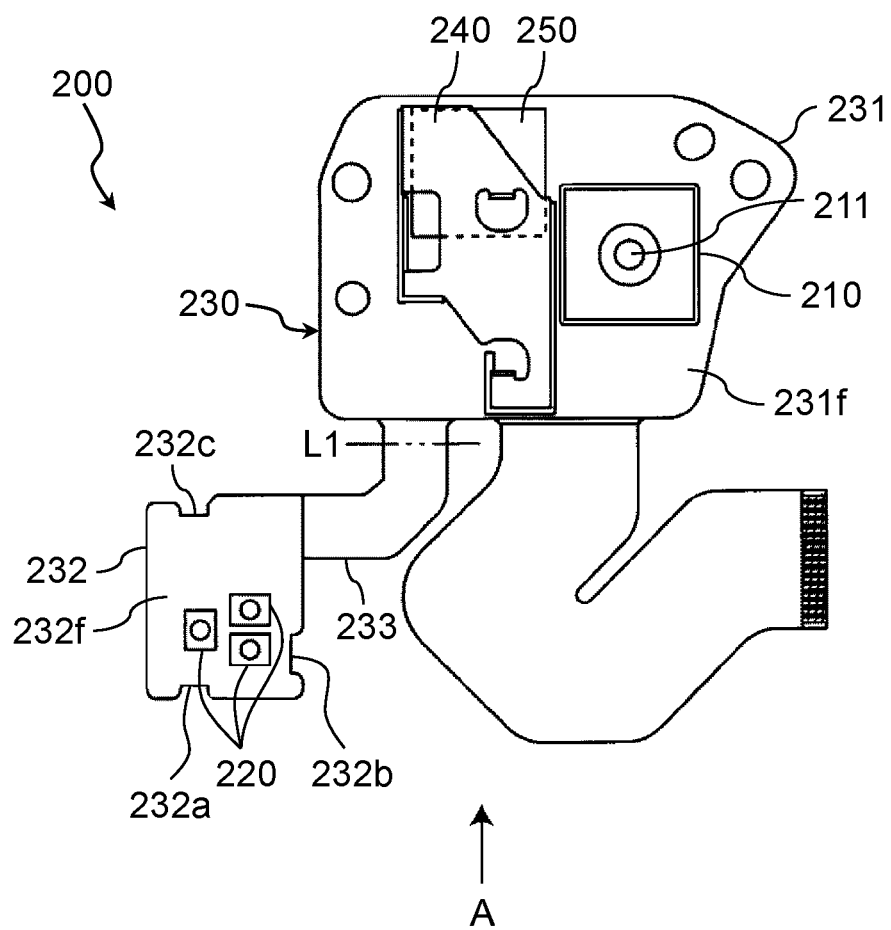
FIG. 4 is a plan view of the camera module (first state) according to the present exemplary embodiment.
Figure 5:
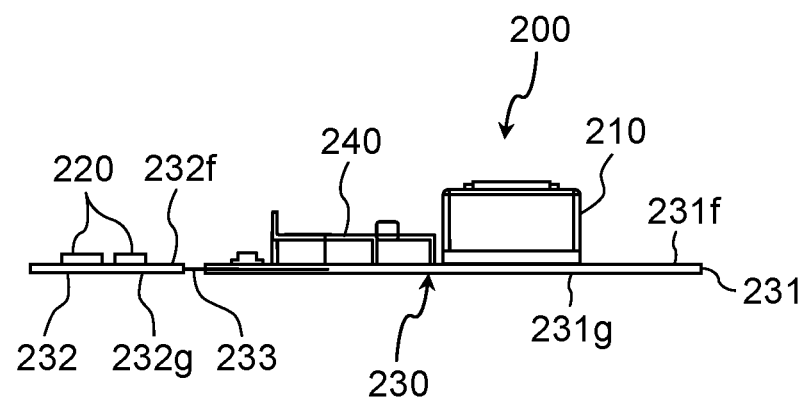
FIG. 5 is a view as viewed from a direction of arrow A in FIG. 4.
Figure 6:
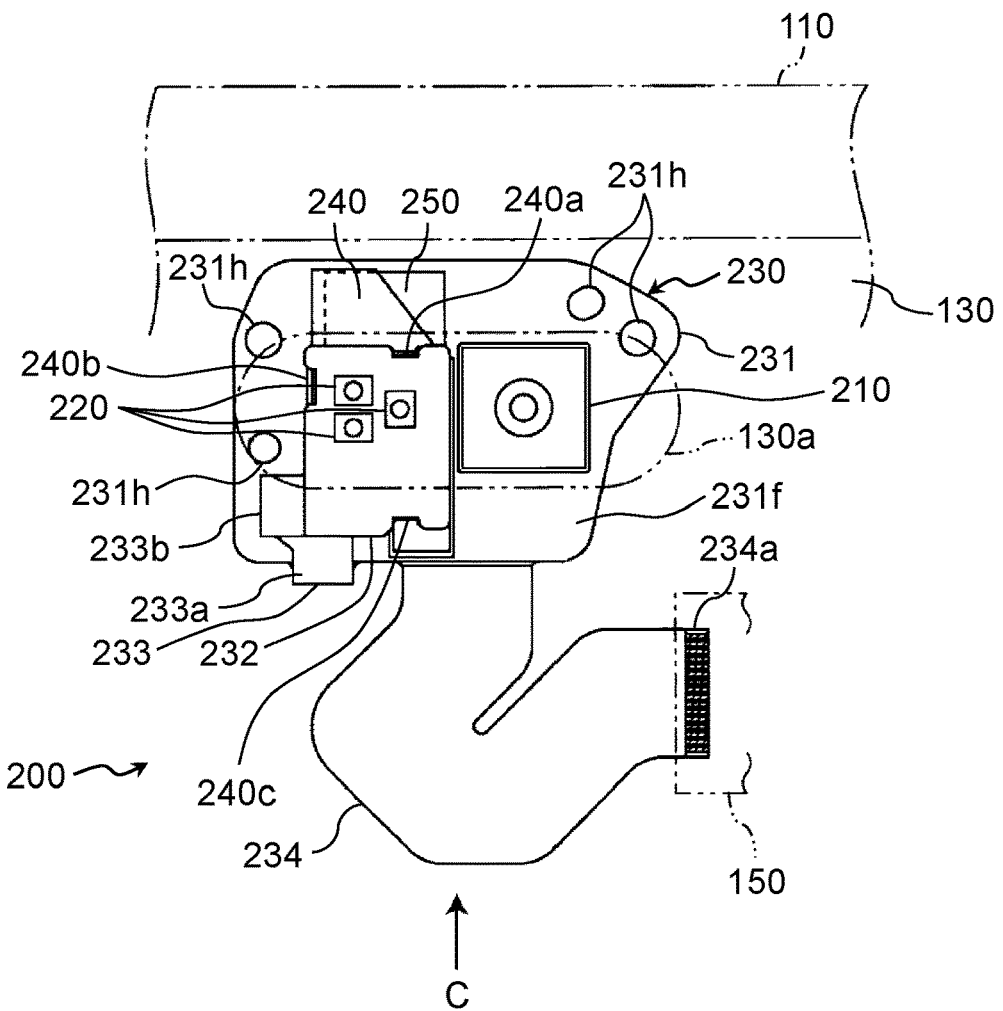
FIG. 6 is an enlarged plan view of an arrangement area of the camera module, indicated by arrow B in FIG. 2.
Figure 7:
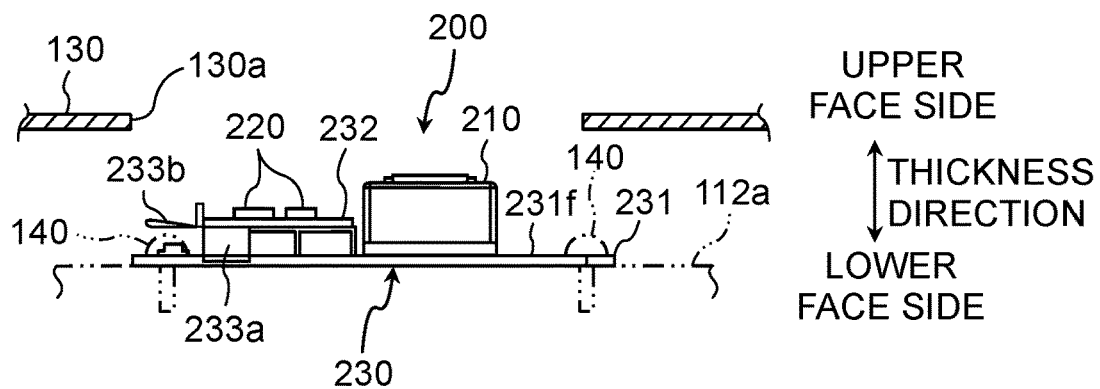
FIG. 7 is a view as viewed from a direction of arrow C in FIG. 6.

The configuration of the camera module will now be described herein with reference to FIGS. 3, 4, and 5. FIG. 3 is a perspective view of the camera module according to the present exemplary embodiment. FIG. 4 is a plan view of the camera module according to the present exemplary embodiment. FIG. 5 is a view as viewed from a direction of arrow A in FIG. 4. FIGS. 3, 4, and 5 show camera module 200 in a first state, and FIGS. 6, 7, which will be described later, show camera module 200 in a second state. The first state refers to, as will be described later, as shown in FIG. 3, a state in which first flexible printed wiring board 233 configuring circuit board 230 is not folded, and first rigid printed wiring board 231, second rigid printed wiring board 232, first flexible printed wiring board 233, and second flexible printed wiring board 234 are almost flush. The second state refers to, as will be described later, as shown in FIGS. 6, 7, a state in which first flexible printed wiring board 233 is folded, and second rigid printed wiring board 232 is disposed on first rigid printed wiring board 231.

Camera module 200 includes imaging unit 210, a plurality of light-emitting diodes 220, and circuit board 230. Light-emitting diodes 220 will appropriately be referred to as LEDs 220.

Imaging unit 210 includes optical system 211 including an optical lens and other components, an imaging element such as a charge coupled device (CCD), a controller, and other components, generates imaging data corresponding to an object image formed, via optical system 211, on an imaging face of the imaging element, and outputs the generated imaging data to a central processing unit of electronic device 100.

LEDs 220 illuminate an object with illumination light. LEDs 220 are formed from high brightness LEDs such as white LEDs.

Circuit board 230 is formed from a rigid flexible printed wiring board, and includes first rigid printed wiring board 231, second rigid printed wiring board 232, first flexible printed wiring board 233, and second flexible printed wiring board 234. The rigid flexible printed wiring board is a printed wiring board integrally formed with a hard, rigid printed wiring board having no flexibility (rigid printed wiring board), and a printed wiring board having flexibility (flexible printed wiring board). When circuit board 230 is in the first state, as described above, first rigid printed wiring board 231, second rigid printed wiring board 232, first flexible printed wiring board 233, and second flexible printed wiring board 234 are flush. Various components including imaging unit 210 and LEDs 220 are mounted over circuit board 230, i.e., first main face 230f. No component is mounted on a second main face lying opposite to first main face 230f. In other words, circuit board 230 is configured to be a one-side mounting printed wiring board.

First rigid printed wiring board 231 is a hard printed wiring board having no flexibility. Various circuit components including imaging unit 210 and camera controlling large scale integrated circuit (LSI) 250 are mounted on first main face 231f of first rigid printed wiring board 231 (part of first main face 230f of circuit board 230). First main face 231f is further provided with hollow shield case 240 having an opening on a side facing first main face 231f so as to cover camera controlling LSI 250. No component is mounted on second main face 231g lying opposite to first main face 231f of first rigid printed wiring board 231.

Second rigid printed wiring board 232 is a hard printed wiring board having no flexibility. Various circuit components including LEDs 220 are mounted on first main face 232f of second rigid printed wiring board 232 (part of first main face 230f of circuit board 230). No component is mounted on second main face 232g lying opposite to first main face 232f of second rigid printed wiring board 232.

First flexible printed wiring board 233 is a film-shaped printed wiring board that has flexibility and thus is foldable (can be folded). First flexible printed wiring board 233 electrically couples a circuit on first rigid printed wiring board 231 and a circuit on second rigid printed wiring board 232. First flexible printed wiring board 233 couples first rigid printed wiring board 231 and second rigid printed wiring board 232 in a connector-less manner. First flexible printed wiring board 233 has first portion 233a and second portion 233b respectively extending in directions approximately orthogonal to each other, and has an approximately L-shape when viewed in plan.

Second flexible printed wiring board 234 is a film-shaped printed wiring board that has flexibility and thus is foldable (can be folded). Second flexible printed wiring board 234 electrically couples the circuit on first rigid printed wiring board 231 and a circuit on electronic device 100. Second flexible printed wiring board 234 is coupled to first rigid printed wiring board 231 in a connector-less manner. Terminal portion 234a that can be coupled to connector 150 of electronic device 100 is formed on another end of second flexible printed wiring board 234.

When first flexible printed wiring board 233 is not folded, i.e., circuit board 230 is in the first state, as described above, first rigid printed wiring board 231, second rigid printed wiring board 232, first flexible printed wiring board 233, and second flexible printed wiring board 234 are flush. First main face 231f of first rigid printed wiring board 231, on which imaging unit 210 is mounted, and first main face 232f of second rigid printed wiring board 232, on which LEDs 220 are mounted, face in an identical direction.

Shield case 240 disposed on first main face 231f of first rigid printed wiring board 231 is configured to be available as a holder for holding second rigid printed wiring board 232 higher than first main face 231f of first rigid printed wiring board 231. Shield case 240 is configured to be capable of disposing and fixing second rigid printed wiring board 232 onto upper face 240f of shield case 240 in a state in which first flexible printed wiring board 233 is folded twice, as will be described later, and first main face 231f of first rigid printed wiring board 231 and first main face 232f of second rigid printed wiring board 232 face in an identical direction. Specifically, upper face 240f of shield case 240 is formed with a plurality of projections 240a, 240b, 240c, and second rigid printed wiring board 232 is formed with a plurality of recesses 232a, 232b, 232c, so as to be capable of positioning second rigid printed wiring board 232 onto upper face 240f of shield case 240 when second rigid printed wiring board 232 is disposed onto upper face 240f of shield case 240 to allow the plurality of recesses 232a, 232b, 232c and the plurality of projections 240a, 240b, 240c to engage to each other.

1-3. Configuration of Camera Module Attached to Electronic Device

A configuration of camera module 200 attached to electronic device 100 will now be described herein. FIG. 6 is an enlarged plan view of an arrangement area of the camera module, indicated by arrow B in FIG. 2. FIG. 7 is a view as viewed from a direction of arrow C in FIG. 6.

When camera module 200 is attached to electronic device 100, the plurality of recesses 232a, 232b, 232c of second rigid printed wiring board 232 and the plurality of projections 240a, 240b, 240c of shield case 240 are engaged, and second rigid printed wiring board 232 is fixed onto upper face 240f of shield case 240 on first rigid printed wiring board 231. First flexible printed wiring board 233 is folded twice, and first main face 231f of first rigid printed wiring board 231, on which imaging unit 210 is mounted, and first main face 232f of second rigid printed wiring board 232, on which LEDs 220 are mounted, face in an identical direction. Second rigid printed wiring board 232 is held by shield case 240 higher than first main face 231f of first rigid printed wiring board 231.

First rigid printed wiring board 231 is formed with screw holes 231h. Screws 140 are inserted into screw holes 231h and screwed to lower housing main body 112a configuring a lower portion of housing main body 110 of electronic device 100 to fix first rigid printed wiring board 231 (camera module 200) onto lower housing main body 112a at a position facing an opening of lid 130.

Terminal portion 234a lying at the other end of second flexible printed wiring board 234 is coupled to connector 150 of electronic device 100.

1-4. Creating Camera Module in Second State

A procedure will now be described herein for creating camera module 200 in the second state shown in FIGS. 6, 7 from camera module 200 in the first state shown in FIGS. 3 to 5.

Figure 8:
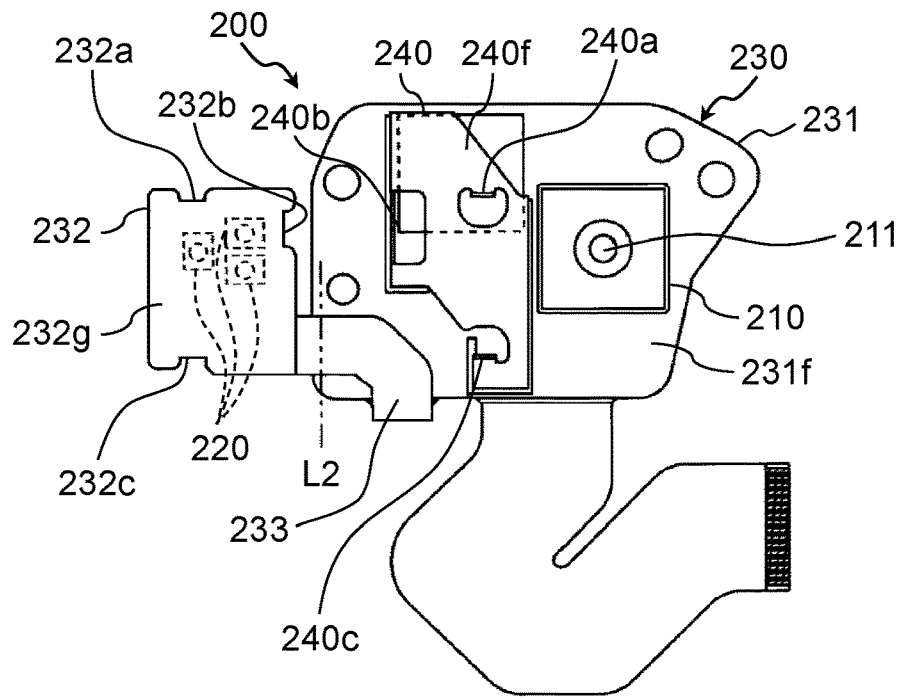
FIG. 8 is a plan view of the camera module, where a first flexible printed wiring board is folded once.

First, in camera module 200 in the first state shown in FIG. 4 is, first flexible printed wiring board 233 is folded at first folding line L1 to reverse second rigid printed wiring board 232 as shown in FIG. 8.

Next, first flexible printed wiring board 233 is folded at second folding line L2 orthogonal to first folding line L1 to further reverse second rigid printed wiring board 232 to allow second rigid printed wiring board 232 and first rigid printed wiring board 231 to face in an identical direction as shown in FIG. 6. In this state, second rigid printed wiring board 232 is disposed onto upper face 240f of shield case 240. At this time, the plurality of recesses 232a, 232b, 232c of second rigid printed wiring board 232 and the plurality of projections 240a, 240b, 240c of shield case 240 are engaged. Second rigid printed wiring board 232 is thus disposed at a predetermined installation position on upper face 240f of shield case 240. Second main face 232g of second rigid printed wiring board 232 and upper face 240f of shield case 240 are fixed by utilizing double sided tape, for example.

In camera module 200 in the second state created as described above, imaging unit 210 and LEDs 220 each lie closer when viewed in plan. LEDs 220 are raised away from first main face 231f of first rigid printed wiring board 231.

Next, camera module 200 in the second state is fixed with screws 140 onto lower housing main body 112a of electronic device 100. Camera module 200 in the first state may be shifted to the second state after camera module 200 is fixed with screws 140 onto an inner wall of lower housing main body 112a of electronic device 100.

1-5. Action

An action of the present exemplary embodiment will now be described herein. Issues of the present disclosure will now first be described herein with reference to a comparative example shown in FIG. 9.

Figure 9:
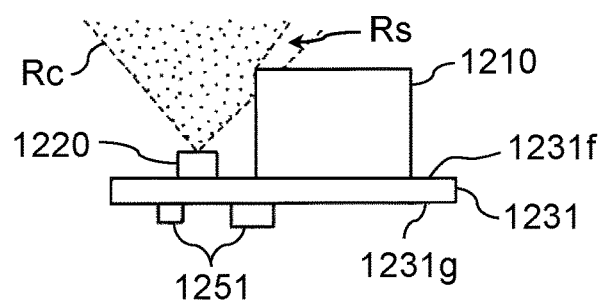
FIG. 9 is a view for describing a comparative example.

FIG. 9 is a view for describing the comparative example. In the comparative example, imaging unit 1210 and LED 1220 are directly mounted on first main face 1231f of printed wiring board 1231. In order to achieve a smaller electronic device, for example, an area of printed wiring board 1231 is limited, and as a result, imaging unit 1210 and LED 1220 often lie closer to each other. Allowing imaging unit 1210 and LED 1220 to lie closer to each other is preferable for preventing as much as possible a shadow behind an object from being generated due to illumination light. However, imaging unit 1210 is often higher than LED 1220, and, as a result, a part of illumination area Rc into which LED 1220 illuminates illumination light, i.e., area Rs, might sometimes be blocked by imaging unit 1210.

First main face 1231f of printed wiring board 1231 might not fully provide a component mounting area, LED 1220 cannot be disposed in a plural number, and thus an amount of light for fully illuminating an object cannot be achieved. As a result, a captured image might sometimes lower in quality in a darker situation. Components 1251 should further be mounted on second main face 1231g, in other words, components should be mounted on both faces of printed wiring board 1231, which in fact leads to an increased number of processes for mounting components and an increased mounting cost, compared with a case of one-side mounting.

Figure 10:
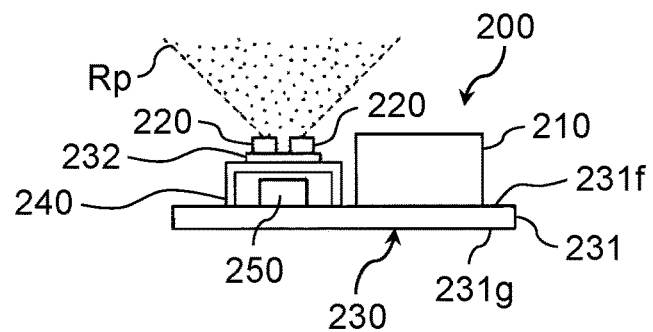
FIG. 10 is a view for describing effects and issues of the present exemplary embodiment.

FIG. 10 is a view for describing effects and issues of the present exemplary embodiment. In the present exemplary embodiment, LEDs 220 are disposed on shield case 240. Positions at which LEDs 220 are disposed are accordingly higher than positions when LEDs 220 are disposed on first main face 231f of first rigid printed wiring board 231. Even when LEDs 220 are disposed in plan under a positional condition identical to a positional condition of the comparative example, illumination area Rp into which LEDs 220 illuminate illumination light would be less likely to be blocked by imaging unit 210. While imaging unit 210 and LEDs 220 are disposed closer, illumination light of LEDs 220 can be less likely to be blocked by imaging unit 210.

In the comparative example, where a problem of blocking illumination light by imaging unit 1210 can arise, first main face 1231f has been limited in area onto which LEDs 1220 can be disposed, and thus disposing LED 1220 in a plural number has been difficult. However, by utilizing upper face 240*f* of shield case 240, which lies higher than first main face 231*f*, as shown in the present exemplary embodiment, an area in which illumination light would be less likely to be blocked by imaging unit 210 can be increased, and thus the plurality of LEDs 220 can be disposed by utilizing this area. An amount of illumination light can thus be increased.

In the present exemplary embodiment, shield case 240 is hollow and has an opening on a side facing first main face 231*f* of first rigid printed wiring board 231, and thus, by utilizing a space under upper face 240*f* of shield case 240, various components can be disposed on first main face 231*f* of first rigid printed wiring board 231. In the present exemplary embodiment, a camera controlling LSI is disposed in the space under upper face 240*f* of shield case 240. As described above, in the present exemplary embodiment, components can be mounted on upper face 240*f* of shield case 240, in addition to first main face 231*f* of first rigid printed wiring board 231.

Since, in circuit board 230, first rigid printed wiring board 231 and second rigid printed wiring board 232 are coupled with first flexible printed wiring board 233 in a connector-less manner, and thus no connector is required, mounting areas, which are available for mounting components, can be increased on first rigid printed wiring board 231 and second rigid printed wiring board 232.

In camera module 200 in the first state, circuit board 230 may be a one-side mounting printed wiring board, and may be mounted with various components by utilizing mounting devices for one-side mounting. Processes for mounting components can thus be simplified, and a mounting cost can thus be reduced.

2. Effects and Other Benefits

Camera module 200 in the second state, according to the present exemplary embodiment, includes imaging unit 210 for capturing an image of an object, LEDs 220 (light emitter) for illuminating the object with illumination light, and circuit board 230 having first main face 230*f* (231*f*, 232*f*) mounted with imaging unit 210 and LEDs 220 (light emitter).

Circuit board 230 includes first rigid printed wiring board 231 mounted with imaging unit 210, second rigid printed wiring board 232 mounted with LEDs 220 (light emitter), and foldable first flexible printed wiring board 233 (flexible printed wiring board) coupling first rigid printed wiring board 231 and second rigid printed wiring board 232.

Further included is shield case 240 (holder) for holding second rigid printed wiring board 232 in a state in which first flexible printed wiring board 233 (flexible printed wiring board) is folded an even number of times, first main face 232*f* of second rigid printed wiring board 232 and first main face 231*f* of first rigid printed wiring board 231 face in an identical direction, and second rigid printed wiring board 232 lies at a separated position from first main face 231*f* of first rigid printed wiring board 231.

Therefore, processes for mounting imaging unit 210 and LEDs 220 (light emitter) can be simplified, and an illumination area into which LEDs 220 (light emitter) illuminate illumination light can appropriately be secured.

Camera module 200 in the first state, according to the present exemplary embodiment, includes imaging unit 210 for capturing an image of an object, LEDs 220 (light emitter) for illuminating the object with illumination light, and circuit board 230 having first main face 230*f* (231*f*, 232*f*) mounted with imaging unit 210 and LEDs 220 (light emitter).

Circuit board 230 includes first rigid printed wiring board 231 mounted with imaging unit 210, second rigid printed wiring board 232 mounted with LEDs 220 (light emitter), and foldable first flexible printed wiring board 233 (flexible printed wiring board) coupling first rigid printed wiring board 231 and second rigid printed wiring board 232.

Further included is shield case 240 (holder) configured to be capable of disposing second rigid printed wiring board 232 in a state in which first flexible printed wiring board 233 (flexible printed wiring board) is folded an even number of times, first main face 232*f* of second rigid printed wiring board 232 and first main face 231*f* of first rigid printed wiring board 231 face in an identical direction, and second rigid printed wiring board 232 lies at a separated position from first main face 231*f* of first rigid printed wiring board 231, and capable of holding second rigid printed wiring board 232 at the separated position.

Therefore, processes for mounting imaging unit 210 and LEDs 220 (light emitter) can be simplified, and an illumination area into which LEDs 220 (light emitter) illuminate illumination light can appropriately be secured.

In the present exemplary embodiment, shield case 240 (holder) is disposed on first main face 231*f* of first rigid printed wiring board 231, and formed in a case shape at least having an opening on a side facing first main face 231*f*.

Camera controlling LSI 250 (predetermined electronic component) is disposed in a space in shield case 240 (holder).

Therefore, an upper face side of shield case 240 (holder) can be utilized to dispose LEDs 220 (light emitter), and the space in shield case 240 (holder) can be utilized to dispose camera controlling LSI 250 (predetermined electronic component).

In the present exemplary embodiment, the holder is shield case 240 (shield member) for shielding electromagnetic noise emitted from camera controlling LSI 250 (predetermined electronic component).

Therefore, shield case 240 (shield member) for shielding electromagnetic noise emitted from camera controlling LSI 250 (predetermined electronic component) can be utilized to configure the holder.

In the present exemplary embodiment, circuit board 230 is a rigid flexible printed wiring board in which first rigid printed wiring board 231, second rigid printed wiring board 232, and first flexible printed wiring board 233 (flexible printed wiring board) are integrated together.

Therefore, smaller camera module 200 can be achieved by coupling first rigid printed wiring board 231 and second rigid printed wiring board 232 via first flexible printed wiring board 233 (flexible printed wiring board) in a connector-less manner.

Other Exemplary Embodiments

The first exemplary embodiment has been described above and exemplified as the technique of the present disclosure. However, the technique of the present disclosure is not limited to the above described first exemplary embodiment, but is applicable to other exemplary embodiments where an amendment, a replacement, an addition, or an omission has been made appropriately.

The other exemplary embodiments will now be described herein.

In the first exemplary embodiment, the light emitter is LEDs 220. However, in the present disclosure, the light emitter may not be LEDs 220, but may be any element as long as illumination light can be illuminated.

In the first exemplary embodiment, the holder is formed from shield case 240. However, in the present disclosure, the holder is not limited to shield case 240, but may be any member that can hold a light emitter such as LEDs 220 at a separated position from first main face 231f of first rigid printed wiring board 231. For example, the holder may be a lifting up stand, or an installation plate attached to a side of imaging unit 210, for example.

In the first exemplary embodiment, first flexible printed wiring board 233 is folded twice to dispose second rigid printed wiring board 232 onto first rigid printed wiring board 231. However, in the present disclosure, any number of folding may be applied, such as four times or six times, as long as the number is an even number.

The first exemplary embodiment has been described with an example where the camera module according to the present disclosure is applied to a tablet computer. However, the electronic device according to the present disclosure is widely applicable to electronic devices each mounted with a camera module.

The exemplary embodiments have been described above and exemplified as the technique of the present disclosure. The accompanying drawings and detailed description have been provided for this purpose.

Accordingly, the components described in the appended drawings and the detailed description include not only components essential for solving the above problem, but may also include components that are not essential for solving the above problem so as to exemplify the above-mentioned technique. Therefore, it should not be immediately construed that these components that are not essential are essential even if the components are described in the accompanying drawings and the detailed description.

Since the above described exemplary embodiments are for exemplifying the technique of the present disclosure, various modifications, replacements, additions, and omissions can be made within the scope of the appended claims or of their equivalents.

The present disclosure is widely usable in camera modules each including an imaging unit and a light emitter.

What is claimed is:

1. A camera module comprising:
   an imaging sensor configured to capture an image of an object;
   a light emitter configured to illuminate the object with illumination light; and
   a circuit board including:
   a first rigid printed wiring board mounted with the imaging sensor;
   a second rigid printed wiring board mounted with the light emitter; and
   a foldable flexible printed wiring board connecting the first rigid printed wiring board and the second rigid printed wiring board;
   wherein,
   the first rigid printed wiring board has a holder which is configured to hold the second rigid printed wiring board in a state in which (i) the flexible printed wiring board is folded an even number of times and (ii) the light emitter and the imaging sensor face the same direction,
   the holder is arranged at a position which is different from the imaging sensor, and
   the holder holds the second rigid printed wiring board at a height higher than a surface of the first rigid printed wiring board.

2. The camera module according to claim 1, wherein the holder is disposed on the first main face of the first rigid printed wiring board, and is formed in a case shape at least having an opening on a side facing the first main face, and
   a predetermined electronic component is disposed in a space in the holder.

3. The camera module according to claim 2, wherein the holder is a shield member configured to shield electromagnetic noise emitted from the predetermined electronic component.

4. The camera module according to claim 1, wherein the circuit board is a rigid flexible printed wiring board in which the first rigid printed wiring board, the second rigid printed wiring board, and the flexible printed wiring board are integrated together.

5. A camera module comprising:
   an imaging sensor configured to capture an image of an object;
   a light emitter configured to illuminate the object with illumination light; and
   a circuit board including:
   a first rigid printed wiring board mounted with the imaging sensor;
   a second rigid printed wiring board mounted with the light emitter; and
   a foldable flexible printed wiring board connecting the first rigid printed wiring board and the second rigid printed wiring board;
   wherein,
   the first rigid printed wiring board has a holder which is configured to be capable of holding the second rigid printed wiring board in a state in which (i) the flexible printed wiring board is folded an even number of times and (ii) the light emitter and the imaging sensor face the same direction,
   the holder configured to be capable of arranging at a position which is different from the imaging sensor, and
   the holder holds the second rigid printed wiring board at a height higher than a surface of the first rigid printed wiring board.

6. The camera module according to claim 5, wherein the holder is disposed on the first main face of the first rigid printed wiring board, and is formed in a case shape at least having an opening on a side facing the first main face, and
   a predetermined electronic component is disposed in a space in the holder.

7. The camera module according to claim 6, wherein the holder is a shield member configured to shield electromagnetic noise emitted from the predetermined electronic component.

8. The camera module according to claim 5, wherein the circuit board is a rigid flexible printed wiring board in which the first rigid printed wiring board, the second rigid printed wiring board, and the flexible printed wiring board are integrated together.

* * * * *